(12) United States Patent
Kuwano

(10) Patent No.: US 12,320,034 B2
(45) Date of Patent: Jun. 3, 2025

(54) METHOD OF HEAT-TREATING SILICON WAFER USING LATERAL HEAT TREATMENT FURNACE

(71) Applicant: SUMCO CORPORATION, Tokyo (JP)

(72) Inventor: Yoshihiro Kuwano, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 434 days.

(21) Appl. No.: 18/000,458

(22) PCT Filed: Mar. 18, 2021

(86) PCT No.: PCT/JP2021/011241
§ 371 (c)(1),
(2) Date: Dec. 1, 2022

(87) PCT Pub. No.: WO2021/246024
PCT Pub. Date: Dec. 9, 2021

(65) Prior Publication Data
US 2023/0212786 A1 Jul. 6, 2023

(30) Foreign Application Priority Data
Jun. 4, 2020 (JP) ................. 2020-097915

(51) Int. Cl.
*H01L 21/04* (2006.01)
*C30B 29/06* (2006.01)
(Continued)

(52) U.S. Cl.
CPC ............. *C30B 33/02* (2013.01); *C30B 29/06* (2013.01); *H01L 21/67103* (2013.01); *H01L 21/67313* (2013.01); *H01L 21/67754* (2013.01)

(58) Field of Classification Search
CPC ............. H01L 21/324; H01L 21/67313; H01L 21/225; H01L 21/67013; H01L 21/22;
(Continued)

(56) References Cited

U.S. PATENT DOCUMENTS 4,938,655 A * 7/1990 Asano ............... H01L 21/67781
414/416.11

FOREIGN PATENT DOCUMENTS

JP 63126219 A * 5/1988
JP 03-85725 A 4/1991
(Continued)

OTHER PUBLICATIONS

International Search Report and Written Opinion of the International Searching Authority issued in International Patent Application No. PCT/JP2021/011241, dated Jun. 8, 2021, along with an English translation thereof.
(Continued)

*Primary Examiner* — Gregory A Wilson
(74) *Attorney, Agent, or Firm* — GREENBLUM & BERNSTEIN, P.L.C.

(57) ABSTRACT

A method of heat-treating a silicon wafer using a lateral heat treatment furnace that can improve the product yield by restricting reduction in the lifetime value of silicon wafers placed in the vicinity of dummy blocks placed to equalize the temperature of the region where the wafers are placed. In a method of heat-treating a silicon wafer using a lateral heat treatment furnace, a boat is placed in a hollow cylindrical furnace core tube, and on the boat, at least one of a first additional block between a first dummy block and a wafer group and a second additional block between a second dummy block and the wafer group is placed.

13 Claims, 5 Drawing Sheets

(51) Int. Cl.
    *C30B 33/02*     (2006.01)
    *H01L 21/67*     (2006.01)
    *H01L 21/673*     (2006.01)
    *H01L 21/677*     (2006.01)

(58) Field of Classification Search
    CPC .............. H01L 21/04; H01L 21/67778; H01L 21/67781; F27D 1/0033; F27D 17/001
    See application file for complete search history.

(56) References Cited

FOREIGN PATENT DOCUMENTS

| | | | |
|---|---|---|---|
| JP | 04-329629 A | | 11/1992 |
| JP | 2003151912 A | * | 5/2003 |
| JP | 2006019406 A | * | 1/2006 |
| JP | 2006-49360 A | | 2/2006 |
| JP | 2006049360 A | * | 2/2006 |
| JP | 2009064851 A | * | 3/2009 |
| JP | 2015065411 A | * | 4/2015 |
| JP | 2015106619 A | * | 6/2015 |
| JP | 5924856 B2 | * | 5/2016 |
| JP | 2016072292 A | * | 5/2016 |
| KR | 20090055415 A | * | 6/2009 |
| KR | 20090097007 A | * | 9/2009 |
| WO | WO-2017115573 A1 | * | 7/2017 ............. H01L 21/22 |

OTHER PUBLICATIONS

International Preliminary Report on Patentability issued in International Patent Application No. PCT/JP2021/011241, dated Dec. 6, 2022, along with an English translation thereof.
Extended European Search Report that issued in corresponding European Patent Application No. 21817172.6, dated Jun. 7, 2024.

* cited by examiner

METHOD OF HEAT-TREATING SILICON WAFER USING LATERAL HEAT TREATMENT FURNACE

TECHNICAL FIELD

This disclosure relates to a method of heat-treating a silicon wafer using a lateral heat treatment furnace.

BACKGROUND

A step of thermally diffusing dopants such as phosphorus and boron into a silicon wafer includes a step of depositing the dopants on the surface layer of the silicon wafer (deposition) and a step of diffusing the dopants deposited on the surface layer into the silicon wafer (drive-in). In the drive-in step, typically, a lateral heat treatment furnace (thermal diffusion furnace) is used. In a lateral heat treatment furnace, into a hollow cylindrical furnace core tube having a center axis in the transverse direction, a boat on which a plurality of silicon wafers are arranged so that the main surfaces of the wafers are orthogonal to the center axis is inserted, and the silicon wafers are subjected to heat treatment inside the furnace core tube. There is a known technique in which in the above situation, dummy blocks (heat insulating blocks) made of silicon are placed on both sides of the plurality of silicon wafers in the direction of the center axis of the furnace core tube, thereby equalizing the temperature of the region where the wafers are placed in the furnace core tube.

JP H03-085725 A (PTL 1) discloses "a heat treatment method for wafers, in which wafers are arranged in a tube of a heat diffusion furnace so that the main surfaces of the wafers are orthogonal to the longer direction of the tube, and when performing heat treatment on the wafers in that state, heat insulating blocks slightly smaller than the tube diameter are placed on the sides of a soaking region in a state where the wafers have not been placed into the tube; so as to be distant from the region by at least 10 mm or more on the side where the atmospheric gas flows in, and be close to or distant from the region on the side where the atmospheric gas flows out (Claim 1)". Further, PTL 1 describes "the material of the heat insulating blocks is high purity silicon (Claim 3)".

CITATION LIST

Patent Literature

PTL 1: JP H03-085725 A

SUMMARY

Technical Problem

However, according to studies made by the inventor of this disclosure, when the same dummy blocks are repeatedly used in each heat treatment in a plurality of batches, the lifetime value of silicon wafers in the plurality of silicon wafers that are located on the ends in each batch, that is, the silicon wafers placed in the vicinity of the dummy blocks is significantly reduced through the batches.

In view of the above problem, it could be helpful to provide a method of heat-treating a silicon wafer using a lateral heat treatment furnace that can improve the product yield by restricting reduction in the lifetime value of the silicon wafers placed in the vicinity of the dummy blocks placed to equalize the temperature of the region where the wafers are placed.

Solution to Problem

The inventor made diligent studies to solve the above problem and found the following. First, the inventor considered that the reduction in the lifetime value of the silicon wafers placed in the vicinity of the dummy blocks might be caused due to contamination of the dummy blocks with metal. Specifically, when the same dummy blocks are repeatedly used in each heat treatment in the plurality of batches, metal contaminants (Fe, Ni, Cu, etc.) from the furnace core tube and the like are conceivably gradually deposited on the dummy blocks. In the process of heating the dummy blocks in heat treatment, a gas containing contaminant metals are generated from the dummy blocks. The gas containing the contaminant metals is diffused and is supplied to the silicon wafers placed in the vicinity of the dummy blocks. Accordingly, the silicon wafers placed in the vicinity of the dummy blocks are also contaminated with metals, which conceivably reduces the lifetime value.

However, replacing the dummy blocks after every heat treatment in the plurality of batches is not economical. Further, although removing the contaminant metals from the dummy blocks by performing an ultra-cleaning process (etching using for example a mixed acid solution of hydrofluoric acid and nitric acid) on the dummy blocks after heat treatment in each batch to remove the contaminant metals from the dummy blocks can also be contemplated, yet is not feasible in terms of operation for the following reasons. Some of the reasons include the cost of manufacturing an etching tank large enough to contain the dummy blocks being relatively thick blocks, and the fear of excessive liquid temperature rising during etching if the dummy blocks having a large thickness and a large surface area are subjected to etching.

To address these problems, the present inventor envisaged that placing additional blocks that are larger in size than the dummy blocks and the silicon wafers and are ultraclean between the dummy blocks and the plurality of silicon wafers would inhibit the diffusion of the gas containing contaminant metals derived from the dummy blocks toward the silicon wafers placed in the vicinity of the dummy blocks. A variety of experiments have confirmed that placing such additional blocks can inhibit reduction in the lifetime value of the silicon wafers placed in the vicinity of the dummy blocks.

This disclosure primarily includes the following features based on the above findings.

[1] A method of heat-treating a silicon wafer using a lateral heat treatment furnace (100) prepared to have a hollow cylindrical furnace core tube (12) having a center axis (X) in a transverse direction, and a heater (14) that heats the furnace core tube (12) and is situated around the furnace core tube (12), with one of ends of the furnace core tube (12) being provided with a lid (12A), the other end of the furnace core tube (12) being provided with a gas inlet port (12B), and a furnace wall in the vicinity of the lid (12A) of the furnace core tube (12) being provided with a gas exhaust port (12C), the method comprising:

opening the lid (12A) and placing a boat (16) in the furnace core tube (12) under the following conditions (A) to (C), where a side of the furnace core tube (12) closer to the lid (12A) is defined as a furnace entrance side (H) and a side of the furnace core tube (12) closer to the gas inlet port (12B) is defined as a furnace back side (S):

(A) a plurality of silicon wafers are arranged on the boat (16) such that a main surface of each silicon wafer is orthogonal to the center axis (X) of the furnace core tube (12), thereby forming a wafer group (WF), (B) a first dummy block (18S) having a cylindrical shape with an axis parallel to the center axis (X) of the furnace core tube (12) is placed closer to the furnace back side (S) than the wafer group (WF) on the boat (16), and a second dummy block (18H) having a cylindrical shape with an axis parallel to the center axis (X) of the furnace core tube (12) is placed closer to the furnace entrance side (H) than the wafer group (WF) on the boat (16), and (C) at least one of a first additional block (20S) between the first dummy block (18S) and the wafer group (WF) and a second additional block (20H) between the second dummy block (18H) and the wafer group (WF), on the boat (16) is placed, and the first and second additional blocks (20S, 20H) have (i) a shape projected on an imaginary plane perpendicular to the center axis (X) of the furnace core tube (12) encompassing a shape of the first and second dummy blocks (18S, 18H) and the plurality of silicon wafers projected on the imaginary plane, and a columnar shape with an axis parallel to the center axis (X) of the furnace core tube (12), and (ii) an Fe concentration of less than $1\times10^{11}$ atoms/cm$^3$ and Ni and Cu concentrations of less than $5\times10^{10}$ atoms/cm$^3$;

closing the lid (12A); and heating the furnace core tube (12) using the heater (14) while introducing a gas through the gas inlet port (12B) into the furnace core tube (12) and discharging the gas from the furnace core tube (12) through the gas exhaust port (12C), thereby performing heat treatment on the plurality of silicon wafers.

[2] The method of heat-treating a silicon wafer using a heat treatment furnace, according to [1] above, wherein both the first and second additional blocks (20S, 20H) are placed in (C) above.

[3] The method of heat-treating a silicon wafer using a heat treatment furnace, according to [1] or [2] above, wherein the first and second additional blocks (20S, 20H) are made of silicon.

[4] The method of heat-treating a silicon wafer using a heat treatment furnace, according to any one of [1] to [3] above, wherein a part of the shape of the first and second additional blocks (20S, 20H) projected on the imaginary plane, above the boat (16) has a curvature radius larger than the radius of the plurality of silicon wafers by 5 mm or more.

[5] The method of heat-treating a silicon wafer using a heat treatment furnace, according to any one of [1] to [4] above, wherein a width of the first and second additional blocks (20S, 20H) along the center axis (X) of the furnace core tube (12) is in a range of 10 mm to 20 mm.

[6] The method of heat-treating a silicon wafer using a heat treatment furnace, according to any one of [1] to [5] above, wherein in (C) above, at least one of a third additional block (22S) closer to the furnace back side (S) than the first dummy block (18S) and a fourth additional block (22H) closer to the furnace entrance side (H) than the second dummy block (18H), on the boat (16) is placed, and the third and fourth additional blocks (22S, 22H) satisfy (i) and (ii) above.

[7] The method of heat-treating a silicon wafer using a heat treatment furnace, according to [6] above, wherein both the third and fourth additional blocks (22S, 22H) are placed in (C) above.

[8] The method of heat-treating a silicon wafer using a heat treatment furnace, according to [6] or [7] above, wherein the third and fourth additional blocks (22S, 22H) are made of silicon.

[9] The method of heat-treating a silicon wafer using a heat treatment furnace, according to any one of [6] to [8] above, wherein a part of the shape of the third and fourth additional blocks (22S, 22H) projected on the imaginary plane, above the boat (16) has a curvature radius larger than the radius of the plurality of silicon wafers by 5 mm or more.

[10] The method of heat-treating a silicon wafer using a heat treatment furnace, according to any one of [6] to [9] above, wherein a width of the third and fourth additional blocks (22S, 22H) along the center axis (X) of the furnace core tube (12) is in a range of 10 mm to 20 mm.

[11] The method of heat-treating a silicon wafer using a heat treatment furnace, according to any one of [1] to [10] above, wherein the first and second dummy blocks (18S, 18H) are made of silicon in which any of the concentrations of Fe, Ni, and Cu is $1\times10^{11}$ atoms/cm$^3$ or more.

[12] The method of heat-treating a silicon wafer using a heat treatment furnace, according to any one of [1] to [11] above, wherein a diameter of the first and second dummy blocks (18S, 18H) is equal to a diameter of the plurality of silicon wafers.

[13] The method of heat-treating a silicon wafer using a heat treatment furnace, according to any one of [1] to [12] above, wherein a width of the first and second dummy blocks (18S, 18H) along the center axis (X) of the furnace core tube (12) is in a range of 40 mm to 75 mm.

Advantageous Effect

A method of heat-treating a silicon wafer using a lateral heat treatment furnace, according to this disclosure can improve the product yield by restricting reduction in the lifetime value of the silicon wafers placed in the vicinity of the dummy blocks placed to equalize the temperature of the region where the wafers are placed.

DETAILED DESCRIPTION

First, with reference to FIG. 1, FIG. 2, and FIG. 3, the structure of a lateral heat treatment furnace 100 used for all methods of heat-treating silicon wafers, according to embodiments of this disclosure and Comparative Example will be described. The lateral heat treatment furnace 100 has a liner tube 10, a furnace core tube 12, and a heater 14.

The liner tube 10 is a hollow cylindrical tube having a center axis in the transverse direction, one of the ends of the liner tube is provided with a door 10A, and the other end is provided with an opening 10B with a diameter that is smaller than the inner diameter of the liner tube 10. Further, the furnace wall in the vicinity of the door 10A of the liner tube 10 is provided with a sucking inlet 10C. The material of the liner tube 10 may be quartz, silicon carbide (SiC), or the like.

The furnace core tube 12 is a hollow cylindrical shape having a center axis X in the transverse direction and is located inside the liner tube 10. One end of the furnace core tube 12 is provided with a lid 12A, and the other end is provided with a gas inlet port 12B. Further, the furnace wall in the vicinity of the lid 12A of the furnace core tube 12 is provided with a gas exhaust port 12C. A connecting portion (tapered portion) between the tube body of the furnace core tube 12 and the gas inlet port 12B fits into the opening 10B of the liner tube 10, thus the furnace core tube 12 is fixed to the liner tube 10. The inner diameter of the furnace core tube 12 (tube body) is typically in a range of 160 mm to 360 mm. The material of the furnace core tube 12 may be quartz, silicon carbide (SiC), or the like. Note that although FIGS. 1 to 3 illustrate examples in which the liner tube 10 is located outside the furnace core tube 12, since the furnace core tube 12 may also serves as a liner tube, the liner tube 10 is not necessarily provided.

The heater 14 is situated around the furnace core tube 12 and the liner tube 10 and heats the furnace core tube 12 and the liner tube 10. The heater 14 may be made up of a main heater situated around a middle portion of the furnace core tube 12 and the liner tube 10, and two auxiliary heaters with the main heater therebetween.

Figure 1:
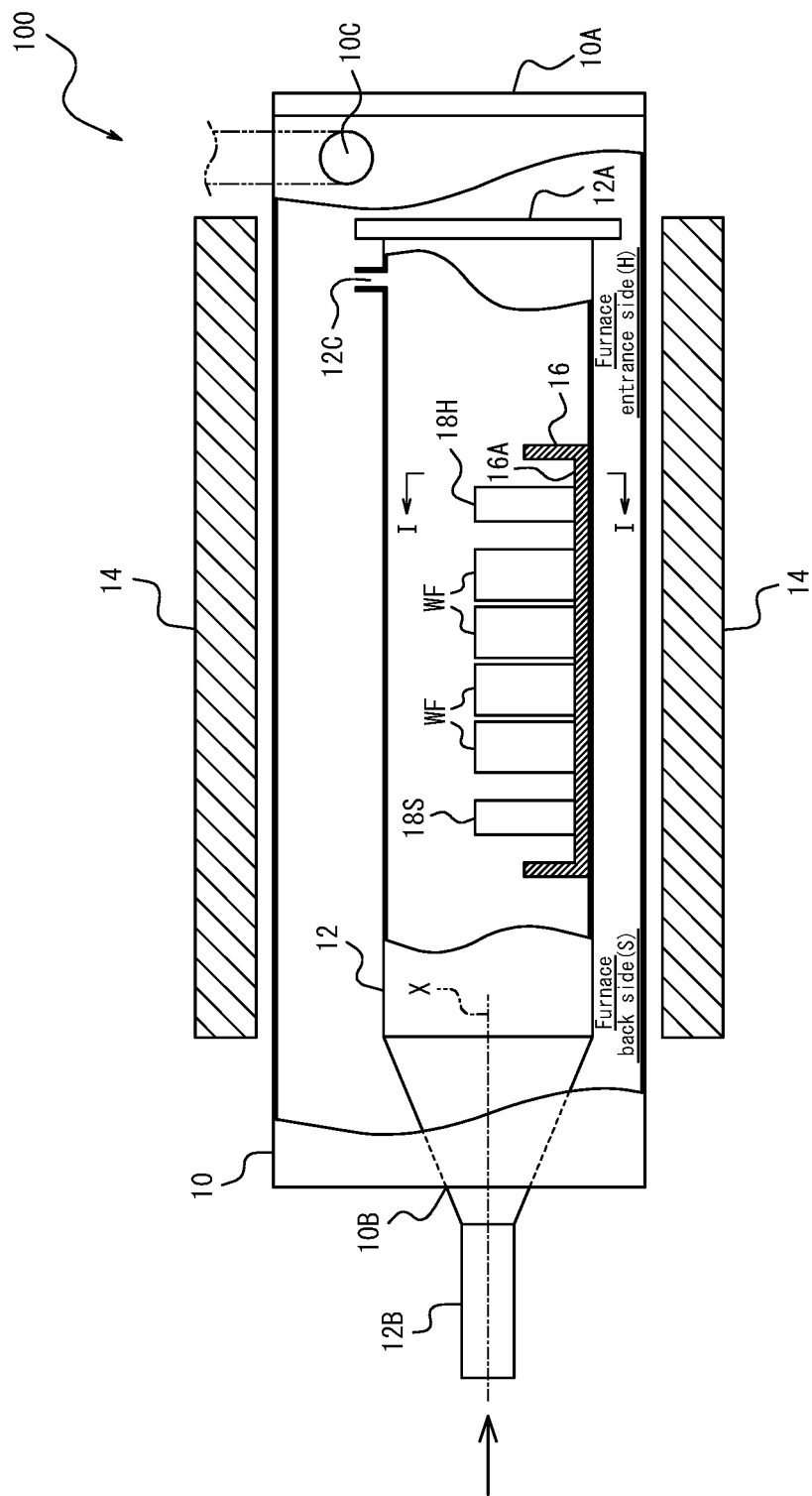
FIG. 1 is a longitudinal sectional view of a lateral heat treatment furnace 100, illustrating a method of heat-treating a silicon wafer, according to Comparative Example.
Figure 2:
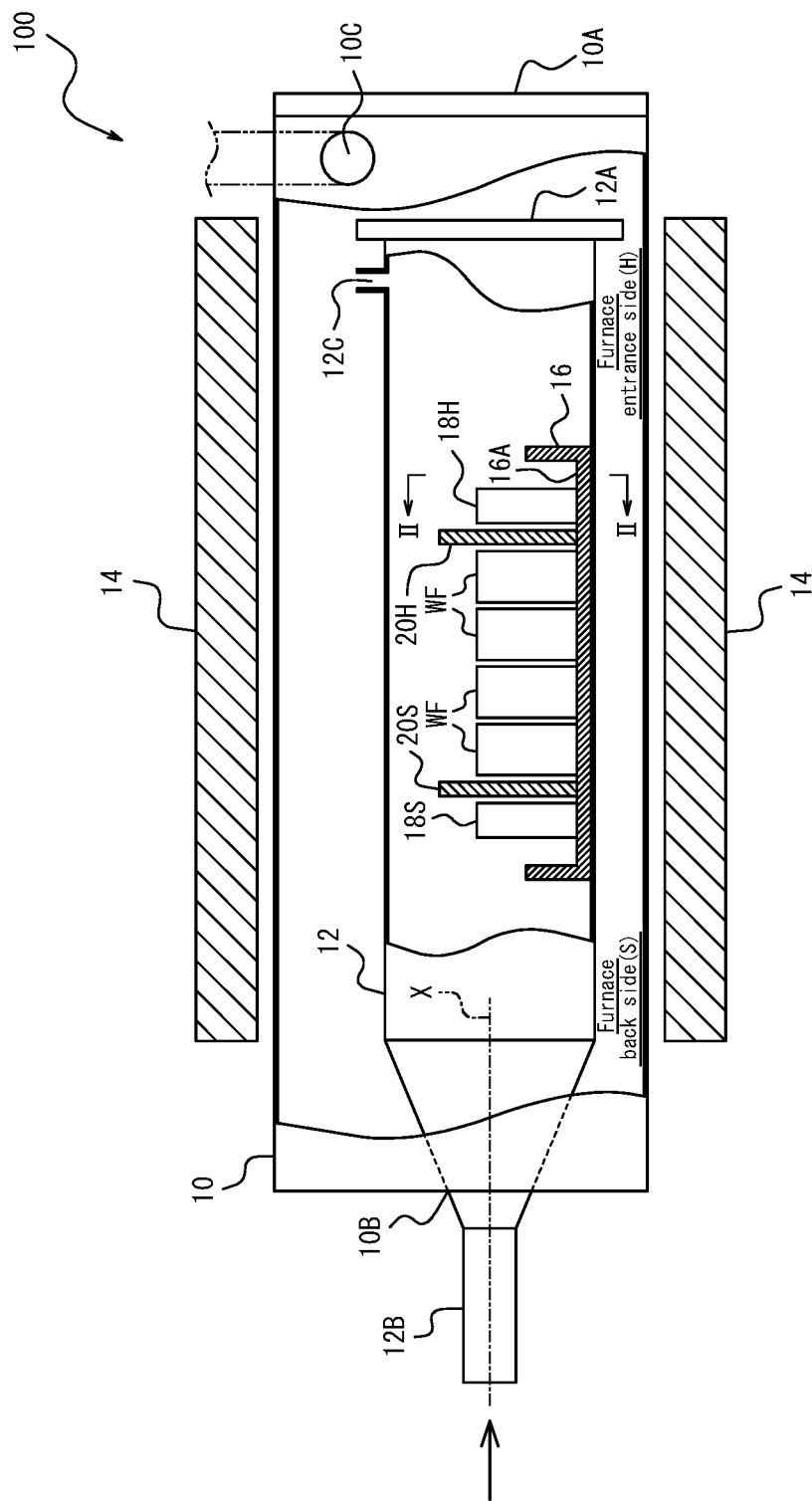
FIG. 2 is a longitudinal sectional view of a lateral heat treatment furnace 100, illustrating a method of heat-treating a silicon wafer, according to an embodiment of this disclosure.
Figure 3:
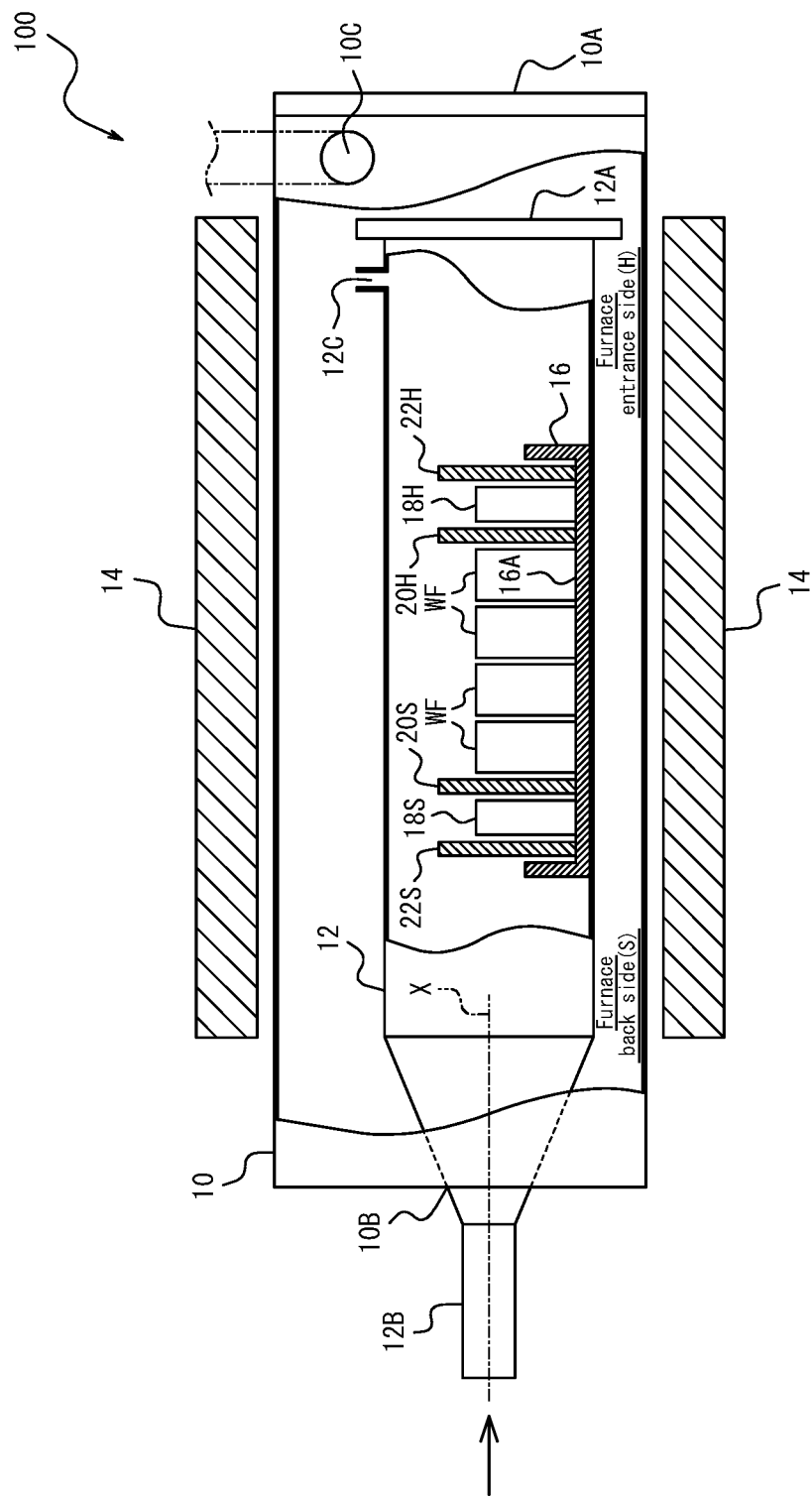
FIG. 3 is a longitudinal sectional view of a lateral heat treatment furnace 100, illustrating a method of heat-treating a silicon wafer, according to another embodiment of this disclosure.

As given in FIGS. 1 to 3, in this specification, a side of the furnace core tube 12 closer to the lid 12A is referred to as "furnace entrance side H" and a side of the furnace core tube 12 closer to the gas inlet port 12B is referred to as "furnace back side S".

In methods of heat-treating a silicon wafer, according to embodiments of this disclosure, when silicon wafers are subjected to heat treatment, a plurality of silicon wafers are arranged on the boat 16 to form a wafer group WF, and the door 10A of the liner tube 10 and the lid 12A of the furnace core tube 12 are opened to allow the boat 16 to enter the furnace core tube 12 through the furnace entrance side H of the furnace core tube 12. After that, the lid 12A of the furnace core tube 12 and the door 10A of the liner tube 10 are closed.

After that, while a gas is introduced into the furnace core tube 12 through the gas inlet port 12B and the gas is discharged from the furnace core tube 12 through the gas exhaust port 12C, heat treatment is performed on the plurality of silicon wafers (wafer group WF) by heating the liner tube 10 and the furnace core tube 12 using the heater 14. When a drive-in process for diffusing dopants deposited on the surface layers into silicon wafers is performed, the gas introduced into the furnace core tube 12 contains a trace amount of oxygen (0.1 vol % to 2 vol %) and has a composition including Ar as the balance. The atmosphere inside the liner tube 10 outside the furnace core tube 12 is the air. The atmospheric gas inside the furnace core tube 12 is discharged through the gas exhaust port 12C by forcibly sucking the air in the space from the sucking inlet 10C of the liner tube 10 using a pump. Accordingly, the atmospheric gas flows in the furnace core tube 12 from the furnace back side S toward the furnace entrance side H. In the case of the drive-in process, the ambient temperature in the furnace core tube 12 may be in a range of 1200° C. to 1350° C., and can be maintained within this temperature range for 10 h to 250 h.

Figure 5A:
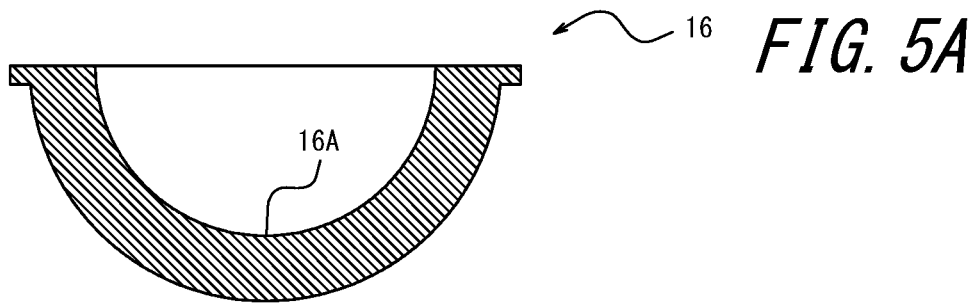
FIG. 5A is a view of a cross section perpendicular to a furnace center axis X of the boat 16.
Figure 5B:
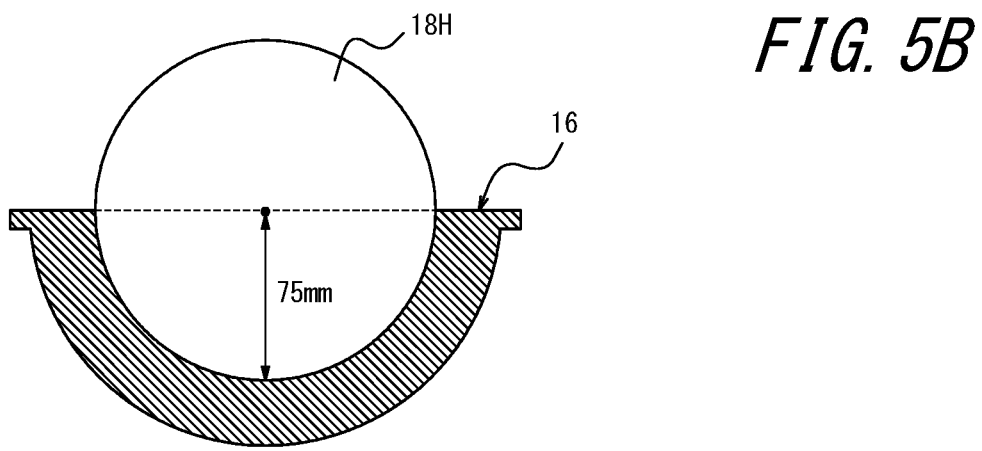
FIG. 5B is a cross-sectional view along line I-I in FIG. 1.

Referring to FIG. 5A in addition to FIGS. 1 to 3, the boat 16 has a pocket 16A constituted by a semicylindrical hollow, in which the plurality of silicon wafers are placed. The boat 16 is placed in the furnace core tube 12 such that the longer direction of the boat agrees with the direction of the center axis X of the furnace core tube 12. As illustrated in FIG. 5A, a cross-sectional shape of the pocket 16A perpendicular to the longitudinal direction of the boat 16 is a semicircular shape having the same curvature radius as the silicon wafers, and the curvature radius is 75 mm for example when the diameter of the silicon wafers is 150 mm. The material of the boat 16 may be silicon carbide (SiC).

In the methods of heat-treating a silicon wafer, according to the embodiments of this disclosure, the boat 16 is placed in the furnace core tube 12 to meet the following conditions (A) to (C).

(A) First, as illustrated in FIGS. 1 to 3, a plurality of silicon wafers having the same diameter are arranged on the boat 16 such that the main surface of each silicon wafer is orthogonal to the center axis X of the furnace core tube 12, thus a wafer group WF is formed. The arrangement of the plurality of silicon wafers is not limited as long as the wafers are arranged in such a manner that they do not fall. For example, one lot (for example 50) silicon wafers can be arranged such that the main surfaces of the silicon wafers adjacent to each other are in contact with each other. FIGS. 1 to 3 illustrate examples where four lots of silicon wafers are placed. Note that when dividing plates (not shown) perpendicular to the longitudinal direction of the boat 16 are provided at regular intervals in the pocket 16A, the silicon wafer group WF of each lot is placed in the pocket 16A without falling. However, the arrangement is not limited to this, and all the silicon wafers placed in the pocket 16A may be arranged such that the main surfaces of silicon wafers adjacent to each other are in contact with each other. In this embodiment, the lower half of each silicon wafer is supported by the pocket 16A by contact, and the upper half thereof is above the upper end of the pocket 16A, namely, is above the boat 16. However, the part of each silicon wafer in contact with the pocket 16A is not limited to the lower half as long as the upright position of each wafers is not disrupted.

(B) A first dummy block 18S having a cylindrical shape with an axis parallel to the center axis X of the furnace core tube 12 is placed on the boat 16, apart from the wafer group WF and closer to the furnace back side S than the wafer group WF, and a second dummy block 18H having a cylindrical shape with an axis parallel to the center axis X of the furnace core tube 12 is placed apart from the wafer group WF and closer to the furnace entrance side H than the wafer group WF. Without these first and second dummy blocks 18S and 18H, the ambient temperature inside the furnace falls in end portions of the region where the wafers are placed in the furnace core tube 12, thus the flat zone length of the furnace core tube 12 is reduced. In that case, in ones of the plurality of silicon wafers located in the end portions, the diffusion of impurities is not sufficient. By contrast, placing the first and second dummy blocks 18S and 18H makes it possible to increase the flat zone length in the furnace core tube 12, thus equalizing the temperature of the region where the wafers are placed in the furnace core tube 12.

In terms of obtaining a sufficiently uniform temperature distribution in the region where the wafers are placed in the furnace core tube 12, the first and second dummy blocks 18S and 18H are preferably made of silicon.

Further, in the same terms, the diameter of the first and second dummy blocks 18S and 18H is preferably equal to the diameter of the plurality of silicon wafers constituting the wafer group WF. For example, when the diameter of the silicon wafers is 150 mm, preferably, the diameter of the first and second dummy blocks 18S and 18H is also 150 mm. In this embodiment, as illustrated in 5B, the lower halves of the first and second dummy blocks 18S and 18H are supported by the pocket 16A by contact, and the upper halves are above the upper end of the pocket 16A, namely, are above the boat 16. However, the parts of the first and second dummy blocks 18S and 18H in contact with the pocket 16A are not limited to the lower halves as long as the upright position of each dummy block is not disrupted.

In terms of obtaining a sufficiently uniform temperature distribution in the region where the wafers are placed in the furnace core tube 12, the width of the first and second dummy blocks 18S and 18H along the center axis X of the furnace core tube 12 is preferably 40 mm or more. On the other hand, when the dummy blocks are excessively long, the productivity is reduced, since a region in the flat zone length used for the product production is reduced; accordingly, the width of the first and second dummy blocks 18S and 18H along the center axis X of the furnace core tube 12 is preferably 75 mm or less.

The distance (separation) between the first dummy block 18S and the wafer group WF and the distance (separation) between the second dummy block 18H and the wafer group WF in the direction of the center axis X of the furnace core tube 12 are preferably 11 mm or more. When the distance is less than 11 mm, the wafer group WF to be products would be contaminated. Further, the distance is preferably 30 mm or less. When the distance exceeds 30 mm, the number of silicon wafers to be products that can be placed is limited, which reduces productivity.

For the first and second dummy blocks 18S and 18H, in this embodiment, in heat treatment in a plurality of batches, the same dummy blocks are used repeatedly without being replaced or being subjected to an ultra-cleaning process (etching using for example a mixed acid solution of hydrofluoric acid and nitric acid). The reasons as are as described above. In this case, the metal contaminants from the furnace core tube and others are supposed to gradually deposit on the dummy blocks. In the silicon of the first and second dummy blocks 18S and 18H, when the concentration of at least any one of Fe, Ni, and Cu is $1 \times 10^{11}$ atoms/cm$^3$ or more, or when the concentration of each transition metal element is $1 \times 10^{11}$ atoms/cm$^3$ or more, there is fear of metal contamination of the dummy blocks.

In this case, in the method of heat-treating a silicon wafer, according to Comparative Example, illustrated in FIG. 1, in heat treatment in a plurality of batches, the gas containing contaminant metals generated from the first and second dummy blocks 18S and 18H diffuses and is supplied toward the silicon wafers placed in the vicinity of the dummy blocks through the batches. Consequently, the silicon wafers placed in the vicinity of the first and second dummy blocks 18S and 18H are also contaminated with metals, which reduces the lifetime value. Since silicon wafers WF having a lifetime value smaller than a predetermined value cannot be obtained as products, the product yield would be insufficient.

(C) To address this problem, it is important that additional blocks that are larger in size than the dummy blocks and the silicon wafers and are ultraclean are provided between the dummy blocks and the plurality of silicon wafers.

Such an embodiment is illustrated in FIG. 2. In FIG. 2, on the boat 16, a first additional block 20S is placed between the first dummy block 18S and the wafer group WF, and a second additional block 20H is provided between the second dummy block 18H and the wafer group WF. In this embodiment, since the gas containing metal contaminants generated from the first dummy block 18S is blocked by the first additional block 20S, the gas is hardly supplied toward the wafer group WF. Similarly, since the gas containing metal contaminants generated from the second dummy block 18H is blocked by the second additional block 20H, the gas is hardly supplied toward the wafer group WF. Thus, the reduction in the lifetime value of the silicon wafers placed in the vicinity of the first and second dummy blocks 18S and 18H can be controlled, thereby improving the product yield. Note that although only one of the first additional block 20S and the second additional block 20H may be provided, both of them are preferably provided in terms of further improving the product yield.

Another embodiment is illustrated in FIG. 3. In FIG. 3, in addition to the first additional block 20S and the second additional block 20H, on the boat 16, a third additional block 22S is placed closer to the furnace back side S than the first dummy block 18S, and a fourth additional block 22H is placed closer to the furnace entrance side H than the second dummy block 18H. In this embodiment, the gas containing metal contaminants generated from the first dummy block 18S is easily confined in the space between the first additional block 20S and the third additional block 22S. Similarly, the gas containing metal contaminants generated from the second dummy block 18H is easily confined in the space between the second additional block 20H and the fourth additional block 22H. Thus, reduction in the lifetime value of the silicon wafers placed in the vicinity of the first and second dummy blocks 18S and 18H can be more reliably controlled. Note that although only one of the third additional block 22S and the fourth additional block 22H may be provided, both of them are preferably provided in terms of further improving the product yield.

Figure 4A:
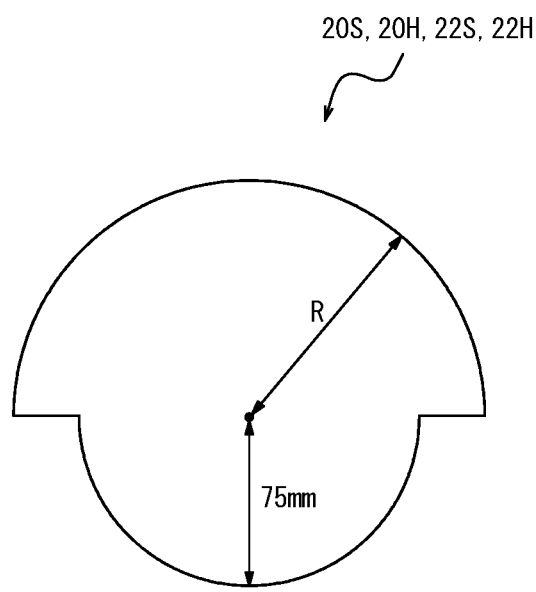
FIG. 4A is a front elevation of first to fourth additional blocks 20S, 20H, 22S, and 22H.
Figure 4B:
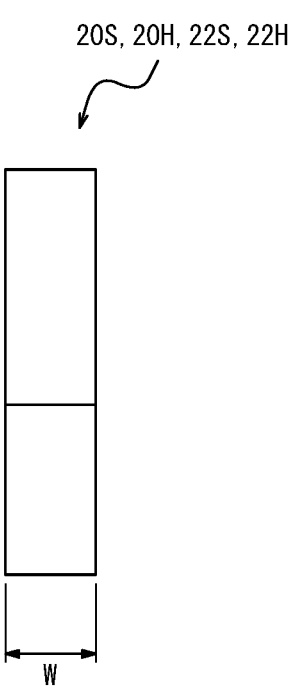
FIG. 4B is a side view of the first to fourth additional blocks 20S, 20H, 22S, and 22H.
Figure 5C:
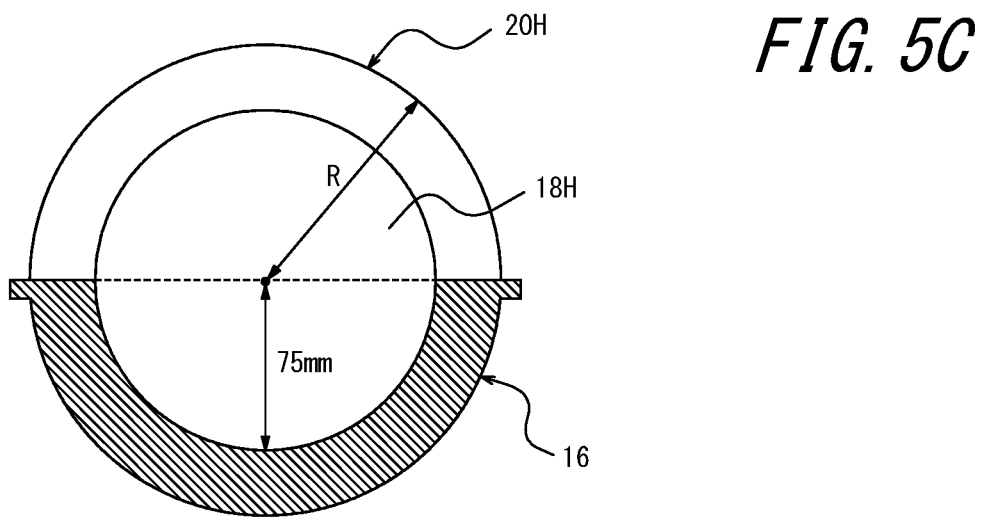
FIG. 5C is a cross-sectional view along line II-II in FIG. 2.

The first to fourth additional blocks 20S, 20H, 22S, and 22H are necessarily larger in size than the first and second dummy blocks 18S and 18H, and the plurality of silicon wafers. Specifically, it is necessary that the shape of the first to fourth additional blocks 20S, 20H, 22S, and 22H projected on an imaginary plane perpendicular to the center axis X of the furnace core tube 12 encompasses the shapes of the first and second dummy blocks 18S and 18H, and the plurality of silicon wafers projected on the imaginary plane and it is necessary that the first to fourth additional blocks 20S, 20H, 22S, and 22H have a columnar shape with an axis parallel to the center axis X of the furnace core tube 12. Referring to FIGS. 4A and 4B and 5C, the first to fourth additional blocks 20S, 20H, 22S, and 22H have a shape meeting the following requirements.

(i-1) Parts of the first to fourth additional blocks 20S, 20H, 22S, and 22H that are below the upper end of the pocket 16A (lower halves in this embodiment) are placed in the pocket 16A. Accordingly, the shape of the parts of the first to fourth additional blocks 20S, 20H, 22S, and 22H that are below the upper end of the pocket 16A projected on the above imaginary plane has the same curvature radius as the radius of the plurality of silicon wafers.

(i-2) Parts of the First to Fourth Additional Blocks 20S, 20H, 22S, and 22H that are above the upper end of the pocket 16A, that is, above the boat 16 (upper halves in this embodiment) serve to inhibit the diffusion of the gas containing contaminant metals. Accordingly, the shape of the parts of the first to fourth additional blocks 20S, 20H, 22S, and 22H that are above the boat 16 projected on the above imaginary plane has a curvature radius R larger than the radius of the plurality of silicon wafers. In terms of sufficiently obtaining the effect of inhibiting the diffusion of the gas containing the contaminant metals, the curvature radius R of the parts is preferably larger than the radius of the plurality of silicon wafers by 5 mm or more. Further, in terms of avoiding the danger of contact of the first to fourth additional blocks 20S, 20H, 22S, and 22H with the furnace core tube 12 when the boat 16 is loaded and unloaded, the curvature radius R of the parts is preferably larger than the radius of the plurality of silicon wafers by a range of 25 mm or less.

Referring to FIG. 4B, the width W of the first to fourth additional blocks 20S, 20H, 22S, and 22H along the center axis X of the furnace core tube 12 is preferably 10 mm or more, more preferably 15 mm or more. In this case, the handling is easy when performing the ultra-cleaning process on the additional blocks. Further, the width W of the first to fourth additional blocks 20S, 20H, 22S, and 22H along the center axis X of the furnace core tube 12 is preferably smaller than the width of the first and second dummy blocks 18S and 18H, specifically, is preferably 20 mm or less. In this case, the economic burden can be reduced when replacing the additional blocks instead of the dummy blocks in every batch, an etching tank can easily be made, and the fear of a rise in liquid temperature during etching can also be avoided; accordingly, it is easy to perform the ultra-cleaning process on the additional blocks after heat treatment in each batch.

In FIG. 2 and FIG. 3, the distance (separation) between the first dummy block 18S and the first additional block 20S and the distance (separation) between the second dummy block 18H and the second additional block 20H in the direction of the center axis X of the furnace core tube 12 are preferably 0 mm or more and 5 mm or less. A distance of 5 mm or less further ensures the effect obtained using the first additional block 20S and the second additional block 20H.

In FIG. 2 and FIG. 3, the distance (separation) between the first additional block 20S and the wafer group WF and the distance (separation) between the second additional block 20H and the wafer group WF in the direction of the center axis X of the furnace core tube 12 are preferably 1 mm or more and 5 mm or less.

In FIG. 2 and FIG. 3, the distance (separation) between the first dummy block 18S and the third additional block 22S and the distance (separation) between the second dummy block 18H and the fourth additional block 22H in the direction of the center axis X of the furnace core tube 12 are preferably 0 mm or more and 5 mm or less. A distance of 5 mm or less further ensures the effect obtained using the third additional block 22S and the fourth additional block 22H.

In terms of not disrupting the uniformity of temperature in the region where the wafers are placed in the furnace core tube 12, the first to fourth additional blocks 20S, 20H, 22S, and 22H are preferably made of silicon.

In terms of preventing the plurality of silicon wafers from being contaminated with metals, the first to fourth additional blocks 20S, 20H, 22S, and 22H are necessarily ultraclean; specifically, it is necessary that the Fe concentration is less than $1 \times 10^{11}$ atoms/cm$^3$, the concentrations of Ni and Cu are less than $5 \times 10^{10}$ atoms/cm$^3$ each. Preferably, the concentrations of Fe, Ni, and Cu are less than $5 \times 10^{10}$ atoms/cm$^3$ each, more preferably, the concentration of each transition metal element is less than $5 \times 10^{10}$ atoms/cm$^3$, and most preferably, the concentration of each transition metal element is less than $1 \times 10^{10}$ atoms/cm$^3$.

The concentrations of the transition metal elements in the dummy blocks and additional blocks can be determined by dissolving the surface layer part of each block with acid or the like and measuring the concentration of the elements contained in the solution for example by ICP-MS.

In this embodiment, in heat treatment in the plurality of batches, the first to fourth additional blocks 20S, 20H, 22S, and 22H are required to be always ultraclean. Accordingly, the first to fourth additional blocks 20S, 20H, 22S, and 22H are replaced with ultraclean blocks in every batch, or subjected to an ultra-cleaning process for removing the transition metal elements on the used blocks in every batch. Specifically, the transition metal elements are removed from the additional blocks by etching using for example a mixed acid solution of hydrofluoric acid and nitric acid. As described above, since the first to fourth additional blocks 20S, 20H, 22S, and 22H are smaller in size than the first and second dummy blocks 18S and 18H, the ultra-cleaning process is easily performed.

EXAMPLES

A lateral heat treatment furnace having the structure illustrated in FIG. 1 was prepared. The inner diameter of a furnace core tube made of SiC was 220 mm. Further, a boat having the structure illustrated in FIG. 5A was prepared. The pocket of the boat formed a semicylindrical hollow having a radius of 75 mm. Seven lots (350) of silicon wafers having a diameter of 150 mm each of which had phosphate glass attached to its surface layer were prepared, and the silicon wafers were placed on the boat such that the main surfaces were orthogonal to the center axis of the furnace core tube and the main surfaces of adjacent silicon wafers in each lot are in contact with one another, to form wafer groups.

On the boat, a first dummy block having a cylindrical shape with an axis parallel to the center axis of the furnace core tube was placed closer to the furnace back side S than all the silicon wafers (wafer group), and a second dummy block having a cylindrical shape with an axis parallel to the center axis of the furnace core tube was placed closer to the furnace entrance side H than all the silicon wafers (wafer group). Each dummy block was a cylindrical silicon block with a diameter of 150 mm and a width of 40 mm, cut out of a single crystal silicon ingot produced by the CZ process. Here, each dummy block had been used repeatedly without being replaced or cleaned in heat treatment of a plurality of batches. Accordingly, the concentrations of transition metal elements in the dummy blocks having been used under equivalent conditions were measured using the above-described method to find that the Fe concentration was $2\times10^{11}$ atoms/cm$^3$, the Ni concentration was $1\times10^{11}$ atoms/cm$^3$, and the Cu concentration was less than $5\times10^{10}$ atoms/cm$^3$ (only the Cu concentration was below the lower detection limit). The distance (separation) between the first dummy block and the wafer group and the distance (separation) between the second dummy block and the wafer group in the direction of the center axis of the furnace core tube were 25.3 mm.

As given in Table 1, in Comparative Example and Examples 1 to 6, the presence and the absence of the first to fourth additional blocks 20S, 20H, 22S, and 22H depicted in FIG. 3 were varied. The shape and the dimensions of each additional block were as depicted in FIGS. 4A and 4B, and the curvature radius of the lower half depicted in FIG. 4A was 75 mm, and the curvature radius R of the upper half is given in Table 1, and the width W depicted in FIG. 4B is given in Table 1. Note that when the additional blocks were provided, the distance (separation) between each additional block and the dummy block closest to the additional block was 1.2 mm. Each additional block was a silicon block cut out of a single crystal silicon ingot produced by the CZ process, and was subjected to the above ultra-cleaning process. Accordingly, when the concentrations of the transition metal elements in each additional block were measured by the above-described method, the Fe concentration was less than $1\times10^{11}$ atoms/cm$^3$, the Ni concentration and the Cu concentration were less than $5\times10^{10}$ atoms/cm$^3$, and each concentration was below the lower detection limit.

In Comparative Example and Examples 1 to 6, the boat was placed into the furnace core tube and heat treatment of the drive-in process was performed. A gas to be introduced into the furnace core tube had a composition including 0.5 vol % oxygen and the balance being Ar. The ambient temperature in the liner tube was set to 1300° C., and the temperature was maintained for 230 h.

Measurement of Lifetime

After heat treatment, of all the silicon wafers, the silicon wafer that was closest to the furnace back side was used as "a monitor wafer S1", and the wafer closest to the furnace entrance side was used as "a monitor wafer H1", and the lifetimes of these monitor wafers were measured by a typical μ-PCD method. The relative values with reference to the lifetime of Comparative Example are given in Table 1.

As apparent from Table 1, the lifetime values of Examples 1 to 6 were larger than that of Comparative Example.

INDUSTRIAL APPLICABILITY

A method of heat-treating a silicon wafer using a lateral heat treatment furnace, according to this disclosure can be suitably used for heat treatment for diffusing dopants such as phosphorus and boron from the surface layer of a silicon wafer to the inside thereof.

REFERENCE SIGNS LIST

100: Lateral heat treatment furnace
10: Liner tube
10A: Door
10B: Opening
10C: Sucking inlet
12: Furnace core tube
12A: Lid
12B: Gas inlet port
12C: Gas exhaust port
14: Heater
16: Boat
16A: Pocket
18S: First dummy block (heat insulating block)
18H: Second dummy block (heat insulating block)
20S: First additional block (barrier block)
20H: Second additional block (barrier block)
22S: Third additional block (barrier block)
22H: Fourth additional block (barrier block)
S: Furnace back side (gas flow-in side)
H: Furnace entrance side (gas flow-out side)
WF: Wafer group (plurality of silicon wafers)
X: Center axis of furnace core tube

The invention claimed is:
1. A method of heat-treating a silicon wafer using a lateral heat treatment furnace prepared to have a hollow cylindrical furnace core tube having a center axis in a transverse direction, and a heater that heats the furnace core tube and is situated around the furnace core tube, with one of ends of the furnace core tube being provided with a lid, the other end of the furnace core tube being provided with a gas inlet port, and a furnace wall in the vicinity of the lid of the furnace core tube being provided with a gas exhaust port, the method comprising:

TABLE 1

| | Additional blocks | | | | R (mm) | W (mm) | Relative value of lifetime | |
|---|---|---|---|---|---|---|---|---|
| | | | | | | | Furnace back side S1 | Furnace entrance side H1 |
| Classification | 20S | 20H | 22S | 22H | | | | |
| Comparative Example | Not provided | Not provided | Not provided | Not provided | — | — | 1 | 1 |
| Example 1 | Provided | Provided | Not provided | Not provided | 90 | 20 | 2.5 | 2.3 |
| Example 2 | Provided | Provided | Not provided | Not provided | 85 | 20 | 2.6 | 2.3 |
| Example 3 | Provided | Provided | Not provided | Not provided | 80 | 20 | 2.7 | 2.4 |
| Example 4 | Provided | Not provided | Not provided | Not provided | 90 | 20 | 2.7 | 1.6 |
| Example 5 | Not provided | Provided | Not provided | Not provided | 90 | 20 | 2.0 | 2.4 |
| Example 6 | Provided | Provided | Provided | Provided | 90 | 15 | 2.3 | 2.0 | opening the lid and placing a boat in the furnace core tube under the following conditions (A) to (C), where a side of the furnace core tube closer to the lid is defined as a furnace entrance side and a side of the furnace core tube closer to the gas inlet port is defined as a furnace back side:
- (A) a plurality of silicon wafers are arranged on the boat such that a main surface of each silicon wafer is orthogonal to the center axis of the furnace core tube, thereby forming a wafer group,
- (B) a first dummy block having a cylindrical shape with an axis parallel to the center axis of the furnace core tube is placed closer to the furnace back side than the wafer group on the boat, and a second dummy block having a cylindrical shape with an axis parallel to the center axis of the furnace core tube is placed closer to the furnace entrance side than the wafer group on the boat, and
- (C) at least one of a first additional block between the first dummy block and the wafer group and a second additional block between the second dummy block and the wafer group, on the boat is placed, and the first and second additional blocks have (i) a shape projected on an imaginary plane perpendicular to the center axis of the furnace core tube encompassing a shape of the first and second dummy blocks and the plurality of silicon wafers projected on the imaginary plane, and a columnar shape with an axis parallel to the center axis of the furnace core tube, and (ii) an Fe concentration of less than $1\times10^{11}$ atoms/cm$^3$ and Ni and Cu concentrations of less than $5\times10^{10}$ atoms/cm$^3$;

closing the lid; and heating the furnace core tube using the heater while introducing a gas through the gas inlet port into the furnace core tube and discharging the gas from the furnace core tube through the gas exhaust port, thereby performing heat treatment on the plurality of silicon wafers.

2. The method of heat-treating a silicon wafer using a heat treatment furnace, according to claim 1, wherein both the first and second additional blocks are placed in (C) above.

3. The method of heat-treating a silicon wafer using a heat treatment furnace, according to claim 1, wherein the first and second additional blocks are made of silicon.

4. The method of heat-treating a silicon wafer using a heat treatment furnace, according to claim 1, wherein a part of the shape of the first and second additional blocks projected on the imaginary plane, above the boat has a curvature radius larger than the radius of the plurality of silicon wafers by 5 mm or more.

5. The method of heat-treating a silicon wafer using a heat treatment furnace, according to claim 1, wherein a width of the first and second additional blocks along the center axis of the furnace core tube is in a range of 10 mm to 20 mm.

6. The method of heat-treating a silicon wafer using a heat treatment furnace, according to claim 1, wherein in (C) above, at least one of a third additional block closer to the furnace back side than the first dummy block and a fourth additional block closer to the furnace entrance side than the second dummy block, on the boat is placed, and the third and fourth additional blocks satisfy (i) and (ii) above.

7. The method of heat-treating a silicon wafer using a heat treatment furnace, according to claim 6, wherein both the third and fourth additional blocks are placed in (C) above.

8. The method of heat-treating a silicon wafer using a heat treatment furnace, according to claim 6, wherein the third and fourth additional blocks are made of silicon.

9. The method of heat-treating a silicon wafer using a heat treatment furnace, according to claim 6, wherein a part of the shape of the third and fourth additional blocks projected on the imaginary plane, above the boat has a curvature radius larger than the radius of the plurality of silicon wafers by 5 mm or more.

10. The method of heat-treating a silicon wafer using a heat treatment furnace, according to claim 6, wherein a width of the third and fourth additional blocks along the center axis of the furnace core tube is in a range of 10 mm to 20 mm.

11. The method of heat-treating a silicon wafer using a heat treatment furnace, according to claim 1, wherein the first and second dummy blocks are made of silicon in which any of the concentrations of Fe, Ni, and Cu is $1\times10^{11}$ atoms/cm$^3$ or more.

12. The method of heat-treating a silicon wafer using a heat treatment furnace, according to claim 1, wherein a diameter of the first and second dummy blocks is equal to a diameter of the plurality of silicon wafers.

13. The method of heat-treating a silicon wafer using a heat treatment furnace, according to claim 1, wherein a width of the first and second dummy blocks along the center axis of the furnace core tube is in a range of 40 mm to 75 mm.

* * * * *